United States Patent
Liu et al.

(10) Patent No.: US 9,059,262 B2
(45) Date of Patent: Jun. 16, 2015

(54) INTEGRATED CIRCUITS INCLUDING CONDUCTIVE STRUCTURES THROUGH A SUBSTRATE AND METHODS OF MAKING THE SAME

(75) Inventors: Yuan-Hung Liu, Hsinchu (TW); Ku-Feng Yang, Dali (TW); Pei-Ching Kuo, Hsinchu (TW); Ming-Tsu Chung, Hsinchu (TW); Hsin-Yu Chen, Taipei (TW); Tsang-Jiuh Wu, Hsinchu (TW); Wen-Chih Chiou, Miaoli (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 555 days.

(21) Appl. No.: 13/033,733

(22) Filed: Feb. 24, 2011

(65) Prior Publication Data

US 2012/0217611 A1    Aug. 30, 2012

(51) Int. Cl.
*H01L 23/52* (2006.01)
*H01L 21/768* (2006.01)
*H01L 23/48* (2006.01)

(52) U.S. Cl.
CPC ........ *H01L 21/76898* (2013.01); *H01L 23/481* (2013.01); *H01L 21/7682* (2013.01); *H01L 2224/0401* (2013.01); *H01L 2224/05009* (2013.01); *H01L 2924/13091* (2013.01)

(58) Field of Classification Search
USPC .................... 257/621, E23.01, E21.238, 737; 438/460
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |

(Continued)

FOREIGN PATENT DOCUMENTS

| | | | |
|---|---|---|---|
| CN | 101783329 | | 7/2010 |
| CN | 101789417 | | 7/2010 |
| WO | WO 2010/011177 | * | 1/2010 |

*Primary Examiner* — Michael Shingleton
(74) *Attorney, Agent, or Firm* — Lowe Hauptman & Ham, LLP

(57) ABSTRACT

An integrated circuit includes a substrate having a first surface and a second surface. At least one conductive structure continuously extends through the substrate. At least one sidewall of the at least one conductive structure is spaced from a sidewall of the substrate by an air gap.

20 Claims, 11 Drawing Sheets

(56) References Cited

U.S. PATENT DOCUMENTS

| | | | |
|---|---|---|---|
| 7,071,546 B2 | 7/2006 | Fey et al. | |
| 7,071,554 B2 * | 7/2006 | Hussein et al. | 257/737 |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,772,046 B2 * | 8/2010 | Pagaila et al. | 438/127 |
| 7,935,571 B2 * | 5/2011 | Ramiah et al. | 438/108 |
| 2009/0127667 A1 | 5/2009 | Iwata | |
| 2009/0145649 A1 * | 6/2009 | Horiuchi et al. | 174/260 |
| 2010/0171226 A1 | 7/2010 | West et al. | |

* cited by examiner

INTEGRATED CIRCUITS INCLUDING CONDUCTIVE STRUCTURES THROUGH A SUBSTRATE AND METHODS OF MAKING THE SAME

TECHNICAL FIELD

The present disclosure relates generally to the field of semiconductor, and more particularly, to integrated circuits including conductive structures through substrates and methods of making the same.

BACKGROUND

Since the invention of the integrated circuit, the semiconductor industry has experienced continual rapid growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limits to the density that can be achieved in two dimensions. One of these limits is the minimum size needed to make these components. Also, when more devices are put into one chip, more complex designs are required.

Three-dimensional integrated circuits (3D IC) are therefore created to resolve the above-discussed limitations. In a conventional formation process of 3D IC, two wafers, each including an integrated circuit, are formed. The wafers are then bonded with the devices aligned. Deep vias are then formed to interconnect devices on the first and second wafers.

BRIEF DESCRIPTION OF THE DRAWINGS

The present disclosure is understood from the following detailed description when read with the accompanying figures. It is noted that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION OF THE DISCLOSURE

Figure 1:
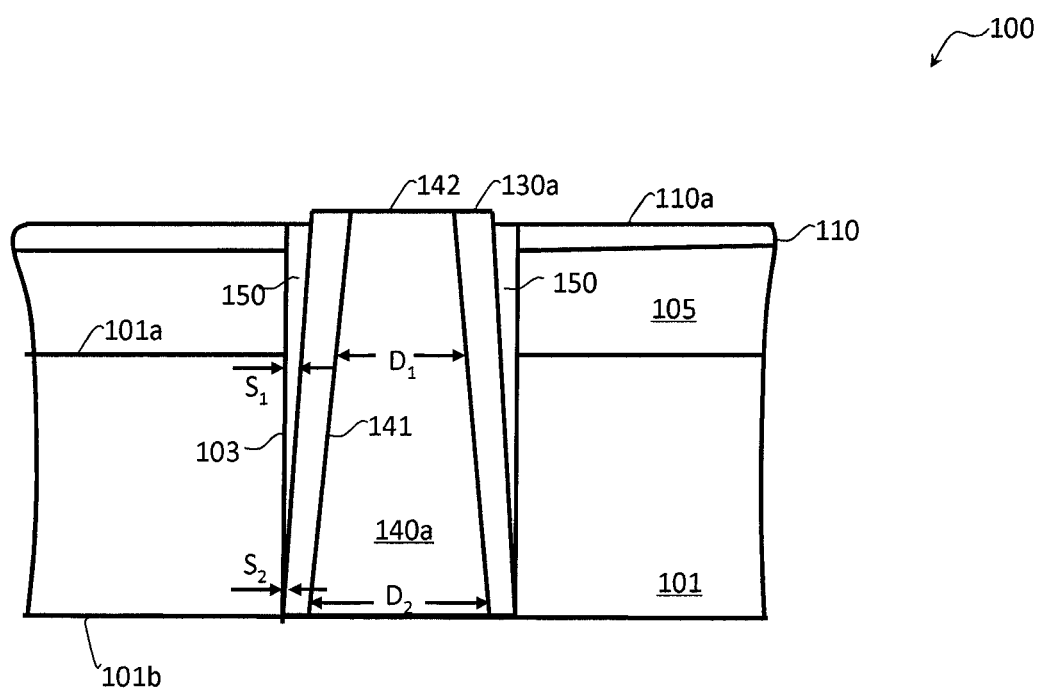
FIG. 1 is a schematic cross-sectional view illustrating an exemplary integrated circuit including a conductive structure through a substrate.

Much higher device density has been achieved using 3D IC technology, and in some applications up to six layers of wafers have been bonded. As a result, the total wire length is significantly reduced. Accordingly, 3D IC technology has the potential of being the mainstream technology of the next generation.

Conventional methods for forming 3D IC also include die-to-wafer bonding. Separate dies are bonded to a common wafer. An advantageous feature of the die-to-wafer bonding is that the size of the dies may be smaller than the size of chips on the wafer.

Recently, through-silicon-vias (TSVs), also referred to as through-wafer vias, are increasingly used as a way of implementing 3D IC. Generally, a bottom wafer is bonded to a top wafer. Both wafers include integrated circuits over substrates. The integrated circuits in the bottom wafer are connected to the integrated circuits in the wafer through interconnect structures. The integrated circuits in the wafers are further connected to external pads through through-silicon-vias. The stacked wafers can be subjected to a sawing process to provide a plurality of stacked die structures.

Applicants find that TSVs are surrounded by the silicon substrate. While the operation of the 3D IC, currents flow through the TSVs, generating heat. The generated heat thermally expands the TSVs that stress devices adjacent to the TSVs. The stress may affect physical and/or electrical characteristics of the devices, changing the performances of the 3D IC.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic cross-sectional view illustrating an exemplary integrated circuit including a conductive structure through a substrate. In FIG. 1, an integrated circuit 100 can include a substrate, e.g., a substrate 101. The substrate 101 can have surfaces 101a and 101b. In some embodiments, the integrated circuit 100 may include various passive and active microelectronic devices, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, FinFET transistors, other types of transistors, and/or any combinations thereof.

In some embodiments, the substrate 101 may include an elementary semiconductor including silicon or germanium in crystal, polycrystalline, or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. In at least one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

Referring to FIG. 1, the integrated circuit 100 can include at least one conductive structure, e.g., a conductive structure 140a. The conductive structure 140a can continuously extend through the substrate 101. At least one sidewall, e.g., a sidewall 141, of the conductive structure 140a can be spaced from a sidewall, e.g., a sidewall 103, of the substrate 101 by at least an air gap, e.g., an air gap 150.

In some embodiments, the air gap 150 can have a space $S_1$ that is adjacent to the surface 101a and a space $S_2$ that is adjacent to the surface 101b. The space $S_1$ can be larger than the space $S_2$. In other embodiments, the air gap 150 can be disposed around the conductive structure 140a. In still other embodiments, the air gap 150 can continuously extend through the substrate 101. In yet still other embodiments, the at least one air gap can include a plurality of grooves along the conductive structure 140a.

Referring again to FIG. 1, in some embodiments the conductive structure 140a can have a width $D_1$ that is adjacent to the surface 101a and a width $D_2$ that is adjacent to the surface 101b. The width $D_2$ can be larger than the width $D_1$. In some embodiments, the conductive structure 140a can have a via structure, a contact structure, a single-damascene structure, a dual-damascene structure, a pillar structure, a line structure, a bulk structure, or any other suitable structures. In some embodiments, the conductive structure 140a can be referred to as a through-silicon-via (TSV) structure.

In some embodiments, the conductive structure 140a can include, for example, a barrier material (e.g., titanium, titanium-nitride, tantalum, tantalum-nitride, other barrier material, and/or combinations thereof), a conductive material (aluminum, copper, aluminum-copper, polysilicon, other conductive material, and/or combinations thereof), other material that is suitable for forming the conductive structure 140a, and/or any combinations thereof.

Referring again to FIG. 1, in some embodiments the integrated circuit 100 can include at least one dielectric layer, e.g., a dielectric layer 130a, between the air gap 150 and the conductive structure 140a. In other embodiments, the dielectric layer 130a can be disposed around the conductive structure 140a. In still other embodiments, a portion of the dielectric layer 130a that is adjacent to the surface 101b may directly contact the substrate 101.

In some embodiments, the dielectric layer 130a can be made of a material including at least one of, for example, oxide, nitride, oxynitride, carbide, oxycarbide, other dielectric materials, and/or any combinations thereof. It is noted that though merely showing a single dielectric layer 130a in FIG. 1, the scope of this application is not limited thereto. In some embodiments, a multiple-layer dielectric structure can be disposed between the air gap 150 and the conductive structure 140a.

Referring to FIG. 1, at least one dielectric layer, e.g., a dielectric layer 105 can be disposed over the substrate 101. The dielectric layer 105 can be made of a material including at least one of, for example, silicon oxide, e.g., undoped silicate glass (USG), boron-doped silicate glass (BSG), phosphor-doped silicate glass (PSG), boron-phosphor-doped silicate glass (BPSG), or the like, silicon oxy-nitride, silicon nitride, a low-k material, or any combinations thereof. In some embodiments, the dielectric layer 105 can be referred to as an inter-layer dielectric (ILD). It is noted that though merely showing a single dielectric layer 105 in FIG. 1, the scope of this application is not limited thereto. In some embodiments, a multiple-layer dielectric structure can be disposed over the substrate 101.

Referring again to FIG. 1, at least one etch-stop layer, e.g., an etch-stop layer 110 can be disposed over the substrate 101. In some embodiments, the surface 142 of the conductive structure 140a is not level with the surface 110a of the etch-stop layer 110. In other embodiments, the etch-stop layer 110 can be made of a material including at least one of, for example, nitride, oxynitride, carbide, oxycarbide, other dielectric materials having an etch selectivity substantially different from that of the dielectric layer 105, and/or any combinations thereof. It is noted that though merely showing a single etch-stop layer 110 in FIG. 1, the scope of this application is not limited thereto. In some embodiments, a multiple-layer etch-stop structure can be disposed over the dielectric layer 105 and the substrate 101.

As noted, the conductive structure 140a generates heat while a current flowing through the conductive structure 140a for serving an electrical and/or thermal conduction between two chips. The heat may thermally expand the conductive structure 140a, which in turn stresses the substrate 101 and/or devices (not shown) which are adjacent to the conductive structure 140a. The stress may change physical and/or electrical characteristics of the devices. Since the air gap 150 is between the conductive structure 140a and the substrate 101, the air gap 150 can release and/or reduce the stress resulting from the thermal expansion of the conductive structure 140a. The stress impact to the devices near to the conductive structure 140a can be reduced.

It is also noted that the air gap 150 may have a dielectric constant of about 1 that is lower than those of dielectric materials. By using the air gap 150, a parasitic capacitance generated from a current flowing through the conductive structure 140a can be desirably reduced. A resistance-capacitance (RC) time delay resulting from the conductive structure 140a can be also reduced.

Figure 2:
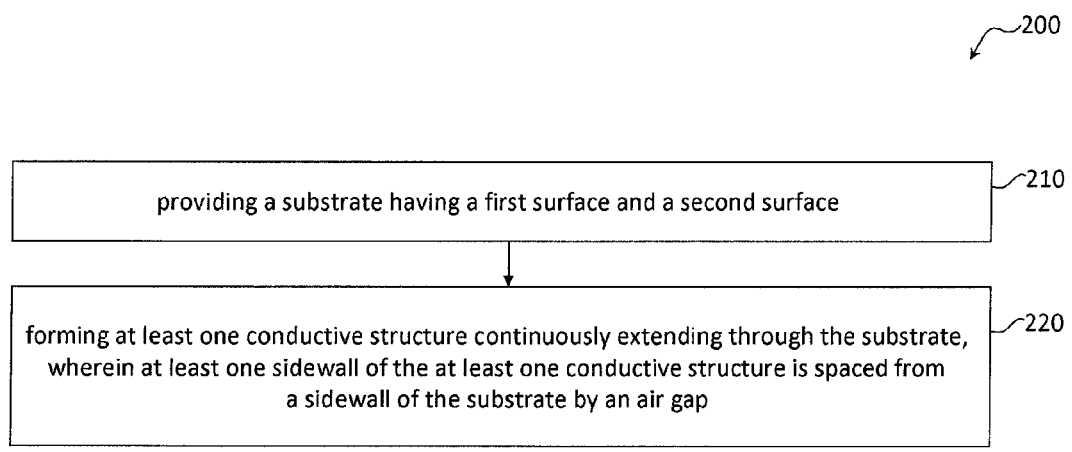
FIG. 2 is a flowchart of an exemplary method of forming an integrated circuit including a conductive structure through a substrate.

FIG. 2 is a flowchart of an exemplary method of forming an integrated circuit including a conductive structure through a substrate. FIGS. 3A-3I are schematic cross-sectional views of an integrated circuit during various fabrication stages. Items of a memory circuit 300 in FIGS. 3A-3I that are the same or similar items of the integrated circuit 100 in FIG. 1 are indicated by the same reference numerals, increased by 200. It is understood that FIGS. 2 and 3A-3I have been simplified for a better understanding of the concepts of the present disclosure. Accordingly, it should be noted that additional processes may be provided before, during, and after the methods of FIGS. 2 and 3A-3I, and that some other processes may only be briefly described herein.

Referring now to FIG. 2, the method 200 can include providing a substrate having a first surface and a second surface (block 210). The method 200 can include forming at least one conductive structure continuously through the substrate. At least one sidewall of the at least one conductive structure is spaced from a sidewall of the substrate by an air gap (block 220).

Figure 3A:
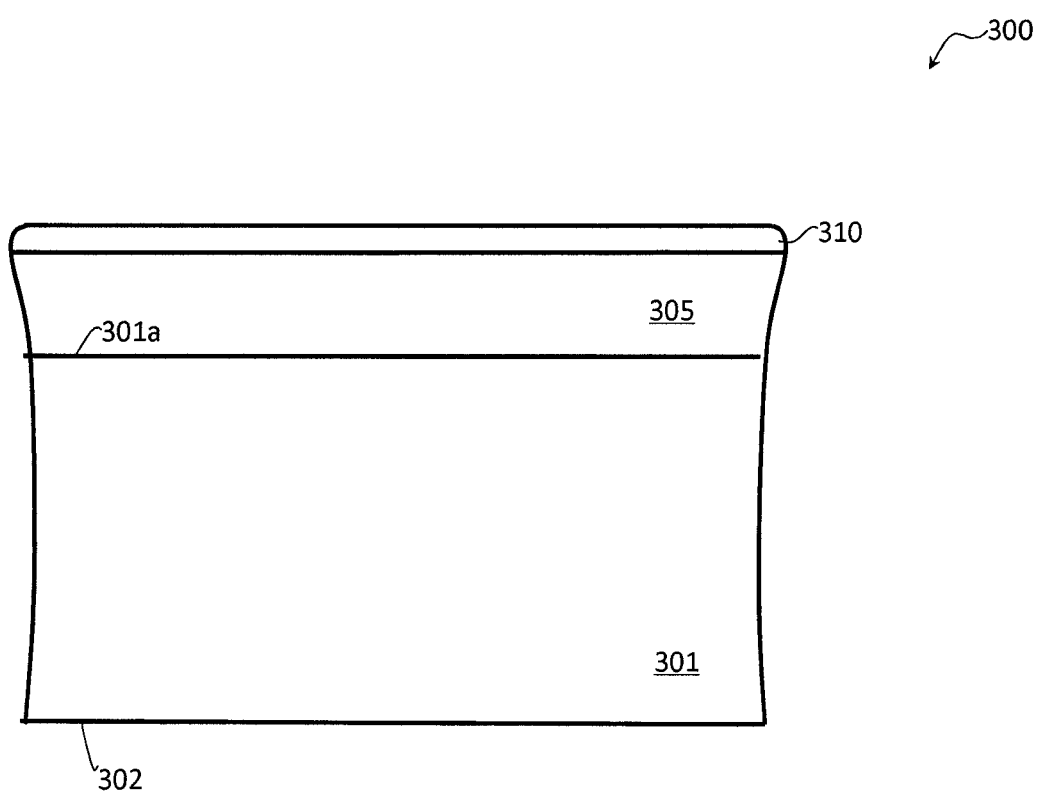
FIGS. 3A-3I are schematic cross-sectional views of an integrated circuit during various fabrication stages.

Referring now to FIGS. 3A-3I in conjunction with FIG. 2, an integrated circuit 300 can be fabricated in accordance with the method 200 of FIG. 2. As shown in FIGS. 2 and 3A, the block 210 can provide a substrate 301. In some embodiments, gates, lightly-doped drains (LDDs), source/drain (S/D) regions, silicides, and/or other transistor structures have been formed over the substrate 301.

Referring again to FIG. 3A, in some embodiments the block 220 can include forming at least one dielectric layer, e.g., a dielectric layer 305, and at least one etch-stop layer, e.g., an etch-stop layer 310, over a surface 301a of the substrate 301. The substrate 301 can have a surface 302 that is opposite to the surface 301a. In some embodiments, the dielectric layer 305 and/or the etch-stop layer 310 can be formed by chemical vapor deposition (CVD), high density plasma CVD, spin-on, or other suitable methods.

Figure 3B:
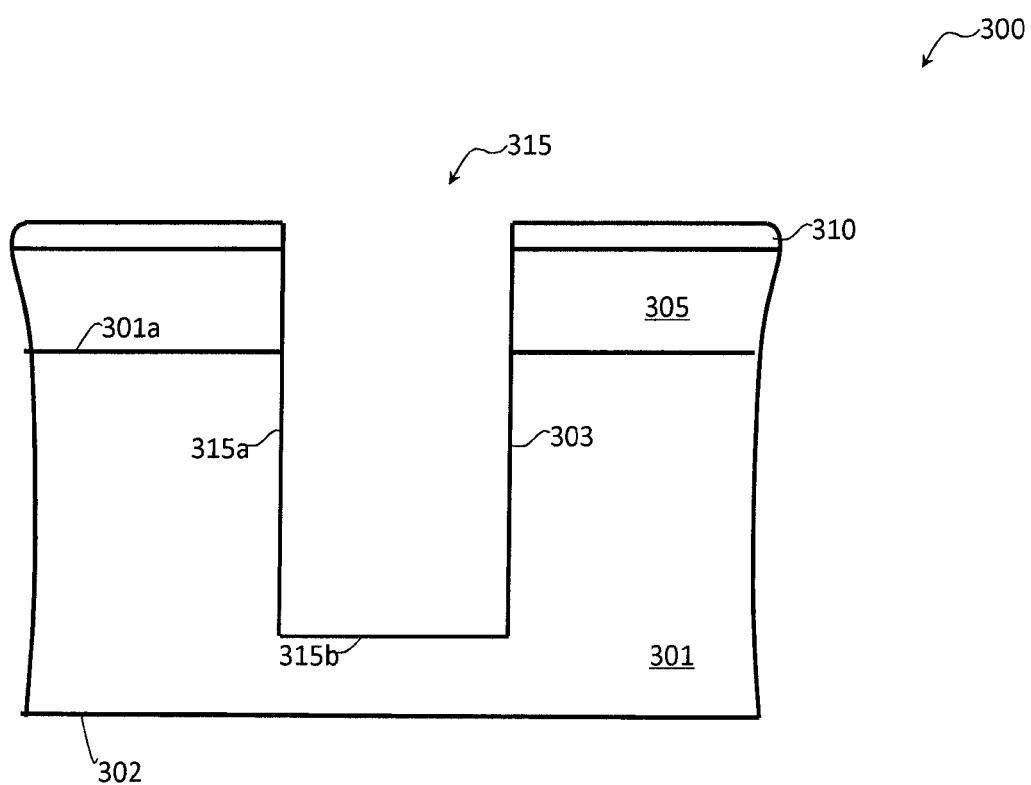

In some embodiments, the block 220 can include forming at least one opening through the surface of the substrate. For example, at least one opening, e.g., an opening 315, can be formed through the surface 301a of the substrate 301 as shown in FIG. 3B. In some embodiments, the opening 315 can be formed through the dielectric layer 305 and the etch-stop layer 310. The opening 315 can have sidewalls 315a and a bottom 315b. The opening 315 can expose the sidewalls 303 of the substrate 301. The bottom portions of the sidewalls 315a of the openings are the sidewalls 303 of the substrate 301. In some embodiments, the opening 315 can be formed by forming a patterned photoresist (not shown) exposing regions that are to be removed. An etch process, e.g., a reactive ion etch (RIE) process, can remove the exposed regions of the etch-stop layer 310, the dielectric layer 305 and the substrate 301. After forming the opening 315, the patterned photoresist can be removed.

Figure 3C:
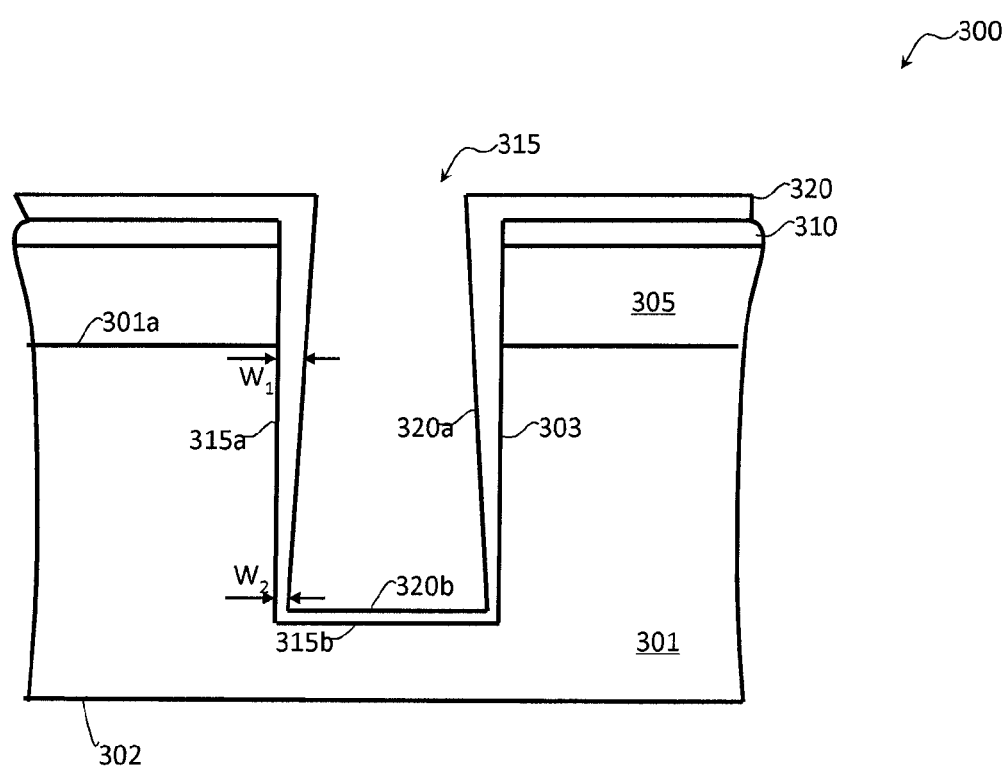
Figure 3D:
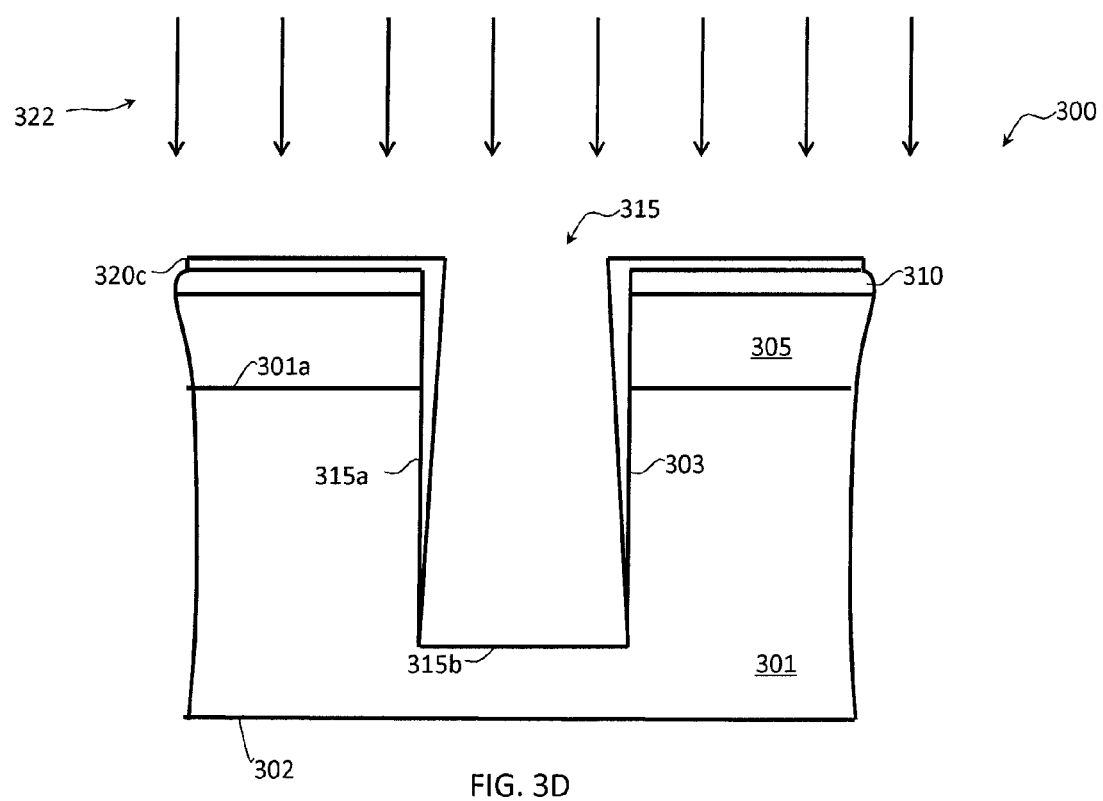

In some embodiments, the block 220 can include forming a sacrificial layer on the sidewall of the substrate that is exposed by the opening. For example, a sacrificial layer 320 can be formed on the sidewalls 303 of the substrate 301 that are exposed by the opening 315 as shown in FIG. 3C. In some embodiments, the sacrificial layer 320 can continuously extend from the sidewall 315a to the bottom 315b of the opening 315. The sacrificial layer 320 can have portions 320a and 320b on the sidewall 315a and the bottom 315b of the opening 315, respectively. In other embodiments, the sacrificial layer 320 can continuously extend over the surface of the etch-stop layer 310 to the sidewall 315a to the bottom 315b of the opening 315.

In some embodiments, the sacrificial layer 320 can be non-conformally formed on the sidewalls 303 of the substrate 301. For example, the sacrificial layer 320 can have portions 320a on the sidewalls 303 of the substrate 301. The portion 320a can have a width $W_1$ that is adjacent to the surface 301a and a width $W_2$ that is adjacent to a bottom 315b of the opening 315. The width $W_1$ can be larger than the width $W_2$.

In some embodiments, the sacrificial layer 320 can be made of a material including at least one of, for example, carbon, nitride, oxynitride, carbide, oxycarbide, other dielectric materials having an etch selectivity substantially different from that of the etch-stop layer 310, and/or any combinations thereof. The sacrificial layer 320 can be formed by, for example, CVD, plasma enhanced CVD (PECVD), other deposition processes, and/or any combinations thereof. In other embodiments, the sacrificial layer 320 can include amorphous carbon and made of ADVANCED PATTERNING FILM™ (APT) PECVD that is commercially available from APPLIED MATERIALS, Inc., CA, U.S.A.

In some embodiments, the block 220 can optionally include substantially removing the sacrificial layer at the bottom of the opening. For example, an etch process 322 can substantially remove the portion 320b of the sacrificial layer 320 (shown in FIG. 3C) at the bottom 315b of the opening 315. In some embodiments, the etch process 322 can be an oxygen-containing plasma etch process. In some embodiments, the etch process 322 can also trim other portions of the sacrificial layer 320 while removing the portion 320b. The sacrificial layer 320c can remain on the surface of the etch-stop layer 310 and/or the sidewalls 315a of the opening 315.

As noted, the etch process 322 is optional. In some embodiments, the etch process 322 is omitted. The portion 320b of the sacrificial layer 320 can be removed by a backside grinding described below in conjunction with FIG. 3I.

Figure 3E:
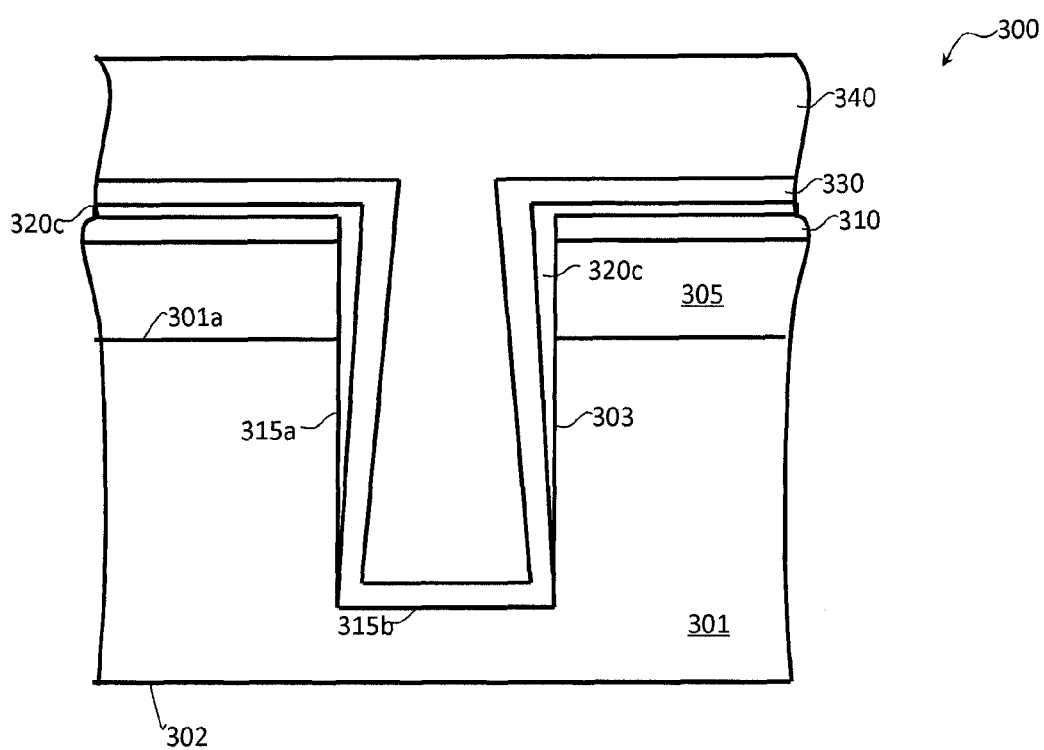

In some embodiments, the block 220 can include forming the at least one conductive structure in the at least one opening. For example, at least one dielectric layer, e.g., a dielectric layer 330, and a conductive material 340 can be formed over the sacrificial layer 320c as shown in FIG. 3E. The dielectric layer 330 can be formed by CVD, high-aspect-ratio process CVD (HARP CVD), HDPCVD, spin-on, and/or other suitable methods. The conductive material 340 can be formed by a CVD, physical vapor deposition (PVD), atomic layer deposition (ALD), an electroplating method, and/or other process to fill the opening 315.

Figure 3F:
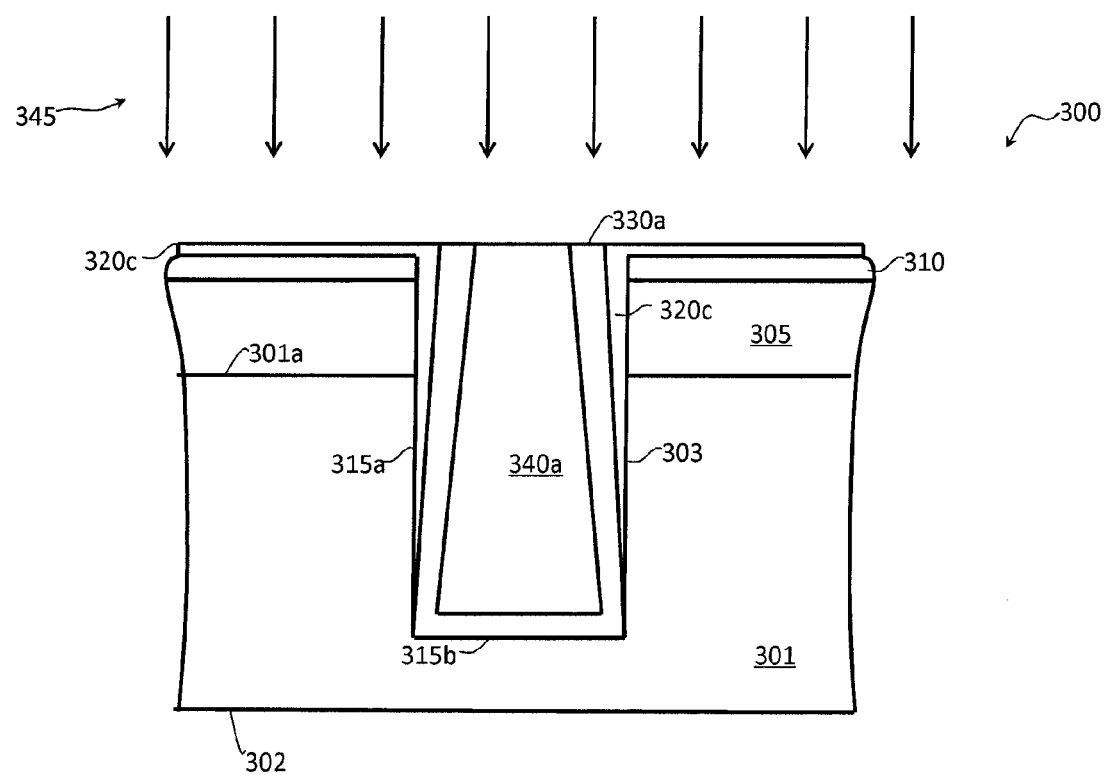

Referring to FIG. 3F, a removing process 345 can remove portions of the dielectric layer 330 and the conductive material 340 to expose the sacrificial layer 320c. The dielectric layer 330a can be formed around the conductive structure 340a. In some embodiments, the removing process 345 can include a chemical mechanical polish (CMP) process. The CMP process can polish the conductive material 340 over the sacrificial layer 320c.

Figure 3G:
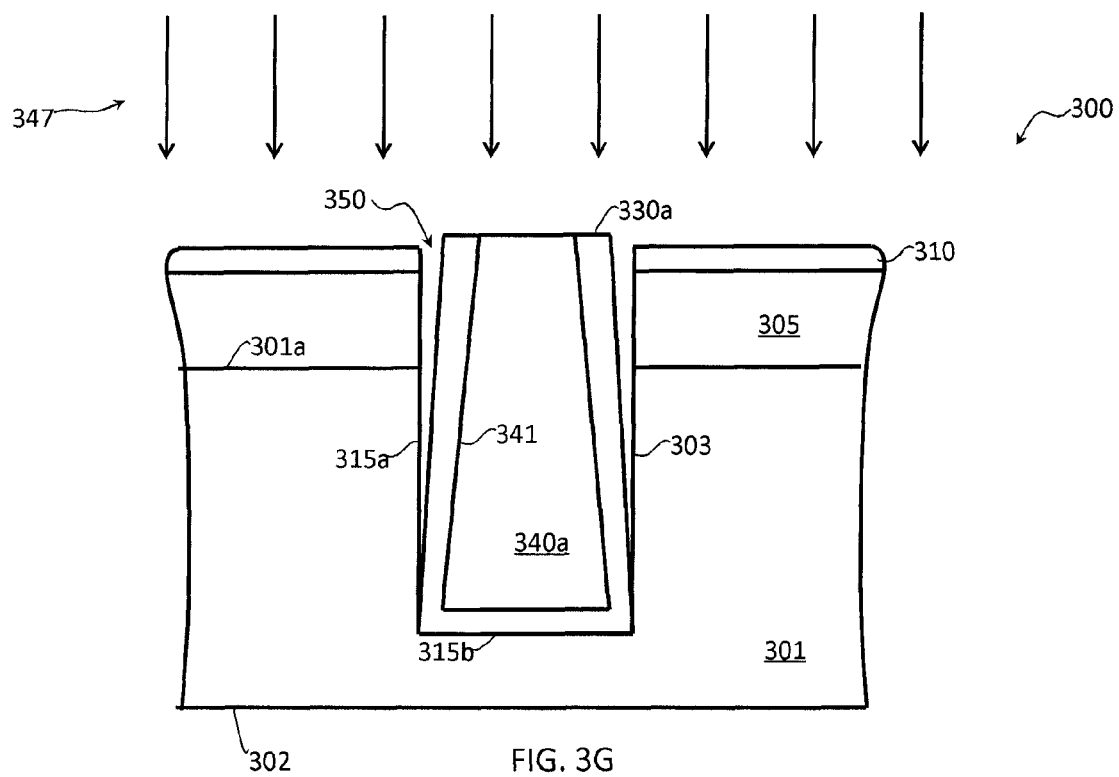

In some embodiments, the block 220 can include substantially removing the sacrificial layer to form the air gap between the sidewall of the substrate and the sidewall of the conductive structure. For example, a removing process 347 can substantially remove the sacrificial layer 320c (shown in FIG. 3F) to form an air gap 350 between the sidewall 303 of the substrate 301 and the sidewall 341 of the conductive structure 340a as shown in FIG. 3G. In some embodiments, the removing process 347 can include a dry etch, e.g., an oxygen-containing plasma etch, a wet etch, and/or any combinations thereof.

As described in conjunction with FIG. 3F, the CMP process of the removing process 345 can stop on the sacrificial layer 320c. Any dish, scratch and/or defect resulting from the CMP process can be stopped on the surface of the sacrificial layer 320c. Since the sacrificial layer 320c is substantially removed by the removing process 347, the dish, scratch and/or defect on the sacrificial layer 320c are removed. Dish, scratch and/or defect can be prevented from being formed on the etch-stop layer 310.

Figure 3H:
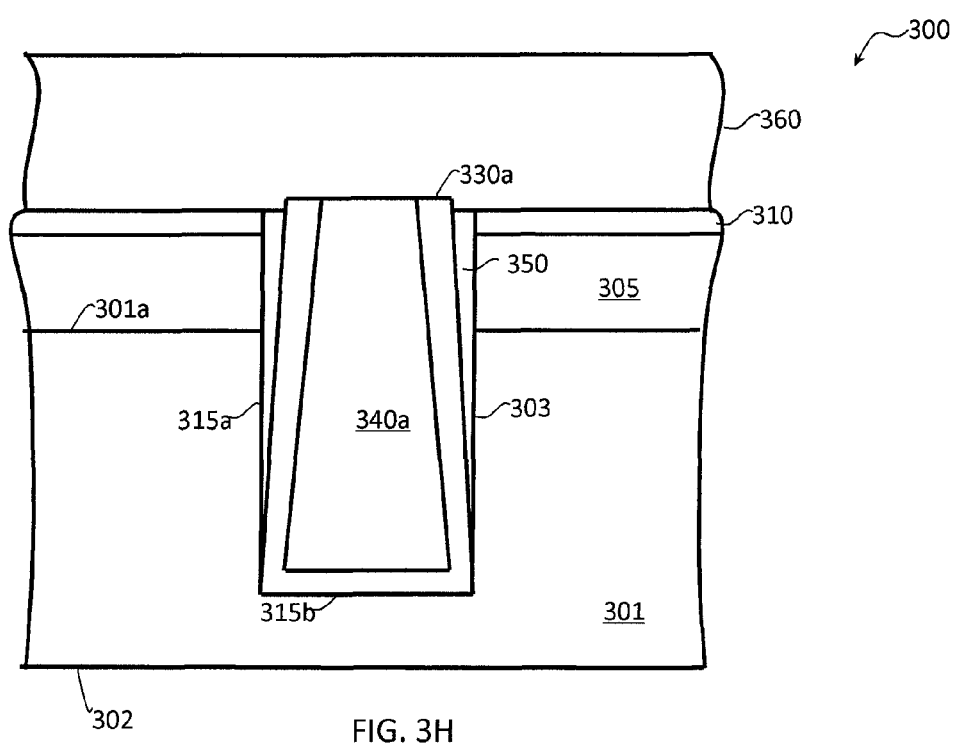

Referring to FIG. 3H, an interconnect structure 360 can be formed over the conductive structure 340a for electrical connection. The interconnect structure 360 can seal the air gap 350. In some embodiments, the interconnect structure 360 can include a plurality of interconnection layers (not shown) spaced by a plurality of isolation layers. The interconnection layers can have a material such as copper, aluminum, tungsten, titanium, tantalum, other conductive material, and/or combinations thereof. The isolation layers can include a material such as oxide, nitride, oxynitride, low dielectric constant (low-k) dielectric, ultra-low-k dielectric, other dielectric, and/or combinations.

In some embodiments, the integrated circuit 300 can include a passivation structure (not labeled) and at least one pad structure (not labeled) formed over the interconnect structure 360. The passivation structure can have at least one opening exposing the pad structure. In some embodiments, the passivation structure can include at least one of a dielectric isolation layer and a polymer layer. The dielectric isolation layer can include a material such as oxide, nitride, oxynitride, other dielectric material, and/or combinations thereof. The polymer layer can include a material such as thermoplastic, thermoset, elastomer, coordination polymer, other suitable polymer, and/or combinations thereof.

In some embodiments, a bump structure can be formed over the pad. In some embodiments, the bump structure 118 can include a material such as a lead-free alloy (such as gold (Au) or a tin/silver/copper (Sn/Ag/Cu) alloy), a lead-containing alloy (such as a lead/tin (Pb/Sn) alloy), copper, aluminum, aluminum copper, other bump metal material, and/or combinations thereof.

Figure 3I:
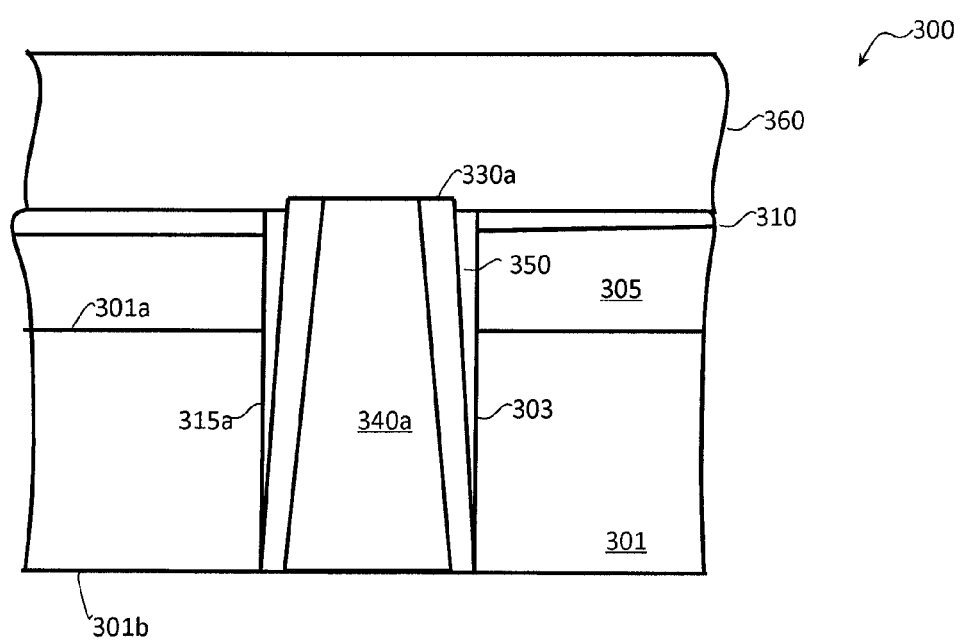

In some embodiments, the block 220 can include removing a portion of the substrate to expose a portion of the conductive structure. For example, a backside grinding can remove a portion of the substrate 301 to expose a portion of the conductive structure 340a as shown in FIG. 3I. In FIG. 3I, the conductive structure 340a can be formed through the substrate 301.

In a first embodiment of the application, an integrated circuit includes a substrate having a first surface and a second surface. At least one conductive structure continuously extends through the substrate. At least one sidewall of the at least one conductive structure is spaced from a sidewall of the substrate by an air gap.

In a second embodiment of the application, a method of forming an integrated circuit includes providing a substrate having a first surface and a second surface. At least one conductive structure is formed, continuously extending through the substrate. At least one sidewall of the at least one conductive structure is spaced from a sidewall of the substrate by an air gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
a substrate having a first surface, a second surface, and an opening defined in the substrate, the opening extending from the first surface through the substrate to the second surface; and
at least one conductive structure continuously extending through the opening, wherein at least one sidewall of the at least one conductive structure is spaced from a sidewall of the opening by an air gap, the at least one conductive structure having a first width within the opening and adjacent to the first surface and a second width within the opening adjacent to the second surface, and the second width being greater than the first width, and a width of the air gap adjacent the first surface is greater than a width of the air gap adjacent the second surface.

2. The integrated circuit of claim 1, wherein the air gap has a first space adjacent to the first surface and a second space adjacent to the second surface, and the first space is larger than the second space.

3. The integrated circuit of claim 1, wherein the air gap is around the at least one conductive structure.

4. The integrated circuit of claim 1, further comprising:
at least one dielectric layer disposed around the at least one conductive structure.

5. The integrated circuit of claim 1, wherein the at least one conductive structure comprises at least one through-silicon-via (TSV) structure.

6. The integrated circuit of claim 1, further comprising:
an etch-stop layer disposed over the first surface of the substrate, wherein a surface of the at least one conductive structure is not level with a surface of the etch-stop layer.

7. An integrated circuit comprising:
a substrate having a first surface and a second surface;
at least one conductive structure continuously extending through the substrate, wherein at least one sidewall of the at least one conductive structure is spaced from a sidewall of the substrate by an air gap, the air gap is around the at least one conductive structure, the air gap has a first space adjacent to the first surface and a second space adjacent to the second surface, and the first space is larger than the second space; and
an etch-stop layer disposed over the first surface of the substrate, wherein a surface of the at least one conductive layer is not level with a surface of the etch-stop layer.

8. The integrated circuit of claim 7, further comprising:
at least one dielectric layer disposed around the at least one conductive structure.

9. The integrated circuit of claim 7, wherein the at least one conductive structure comprises at least one through-silicon-via (TSV) structure.

10. The integrated circuit of claim 7, wherein the at least one conductive structure has a first width adjacent to the first surface and a second width adjacent to the second surface, and the second width is larger than the first width.

11. The integrated circuit of claim 1, further comprising:
an interconnect structure over the substrate, wherein the interconnect structure is electrically connected to the at least one conductive structure.

12. The integrated circuit of claim 1, further comprising:
an interconnect structure over the substrate, wherein the interconnect structure is configured to seal the air gap.

13. The integrated circuit of claim 1, wherein the at least one conductive structure comprises a barrier material and a conductive material, wherein the barrier material comprises at least one of titanium or tantalum.

14. The integrated circuit of claim 4, wherein the dielectric material contacts at least a portion of the sidewall of the opening.

15. The integrated circuit of claim 1, further comprising:
an etch-stop layer disposed over the first surface of the substrate; and
an inter-layer dielectric (ILD) disposed between the etch-stop layer and the first surface of the substrate.

16. The integrated circuit of claim 7, further comprising:
an interconnect structure over the substrate, wherein the interconnect structure is electrically connected to the at least one conductive structure.

17. The integrated circuit of claim 7, further comprising:
an interconnect structure over the substrate, wherein the interconnect structure is configured to seal the air gap.

18. The integrated circuit of claim 7, wherein the at least one conductive structure comprises a barrier material and a conductive material, wherein the barrier material comprises at least one of titanium or tantalum.

19. The integrated circuit of claim 8, wherein the dielectric material contacts at least a portion of the sidewall of the substrate.

20. The integrated circuit of claim 1, wherein a difference between the width of the air gap adjacent the first surface and the width of the air gap adjacent the second surface is substantially equal to a difference between the second width and the first width.

\* \* \* \* \*